(12) United States Patent
Hong et al.

(10) Patent No.: US 9,305,792 B2
(45) Date of Patent: Apr. 5, 2016

(54) TEXTURE-ETCHANT COMPOSITION FOR CRYSTALLINE SILICON WAFER AND METHOD FOR TEXTURE-ETCHING (1)

(75) Inventors: Hyung-Pyo Hong, Iksan-si (KR); Jae-Youn Lee, Iksan-si (KR); Dae-Sung Lim, Iksan-si (KR)

(73) Assignee: DONGWOO FINE-CHEM CO., LTD., Iksan-si, Jeollabuk-do (KR)

( * ) Notice: Subject to any disclaimer, the term of this patent is extended or adjusted under 35 U.S.C. 154(b) by 4 days.

(21) Appl. No.: 13/816,308

(22) PCT Filed: Aug. 12, 2011

(86) PCT No.: PCT/KR2011/005949
§ 371 (c)(1),
(2), (4) Date: Feb. 11, 2013

(87) PCT Pub. No.: WO2012/021026
PCT Pub. Date: Feb. 16, 2012

(65) Prior Publication Data
US 2013/0143403 A1    Jun. 6, 2013

(30) Foreign Application Priority Data

Aug. 12, 2010 (KR) .................. 10-2010-0077621

(51) Int. Cl.
*H01L 21/302* (2006.01)
*C09K 13/00* (2006.01)
*C09K 13/06* (2006.01)
(Continued)

(52) U.S. Cl.
CPC .............. *H01L 21/302* (2013.01); *C09K 13/00* (2013.01); *C09K 13/02* (2013.01); *C09K 13/06* (2013.01); *C09K 13/08* (2013.01); *H01L 31/02363* (2013.01); *H01L 31/182* (2013.01); *H01L 31/1824* (2013.01); *Y02E 10/50* (2013.01)

(58) Field of Classification Search
CPC ........ C09K 13/00; C09K 13/02; C09K 13/06; C09K 13/08; H01L 31/182; H01L 31/1824
See application file for complete search history.

(56) References Cited

U.S. PATENT DOCUMENTS

| 4,137,123 A | 1/1979 | Bailey et al. ................... 156/647 |
| 6,451,218 B1 | 9/2002 | Holdermann .................. 216/99 |

(Continued)

FOREIGN PATENT DOCUMENTS

| CN | 101392376 A | 3/2009 |
| CN | 101634026 A | 1/2010 |

(Continued)

OTHER PUBLICATIONS

G.L. Hollis, "Miscellaneous Surfactant—Fluochemicals", Surfactant Europa, ISBN 978-0-85404-804-5, year 1995, p. 333.*

(Continued)

*Primary Examiner* — Jiong-Ping Lu
(74) *Attorney, Agent, or Firm* — Fitzpatrick, Cella, Harper & Scinto

(57) ABSTRACT

Disclosed herein is an etching composition for texturing a crystalline silicon wafer, comprising, based on a total amount of the composition: (A) 0.1 to 20 wt % of an alkaline compound; (B) 0.1 to 50 wt % of a cyclic compound having a boiling point of 100° C. or more; (C) 0.00001 to 10 wt % of a silica-containing compound; and (D) residual water. The etching composition can maximize the absorbance of light of the surface of a crystalline silicon wafer.

6 Claims, 3 Drawing Sheets

(51) Int. Cl.
*H01L 31/18* (2006.01)
*C09K 13/08* (2006.01)
*C09K 13/02* (2006.01)
*H01L 31/0236* (2006.01)

(56) References Cited

U.S. PATENT DOCUMENTS

| | | | |
|---|---|---|---|
| 6,585,825 B1* | 7/2003 | Skee | 134/3 |
| 7,858,426 B2 | 12/2010 | Cheong et al. | 438/57 |
| 8,540,891 B2 | 9/2013 | Kubelbeck et al. | |
| 2005/0247674 A1 | 11/2005 | Kubelbeck et al. | |
| 2007/0181534 A1 | 8/2007 | Kamimura | |
| 2009/0266414 A1 | 10/2009 | Tsuchiya et al. | 136/256 |
| 2010/0112728 A1 | 5/2010 | Korzenski et al. | 438/3 |
| 2010/0269903 A1* | 10/2010 | Tsuchiya et al. | 136/258 |
| 2013/0137278 A1 | 5/2013 | Hong et al. | 438/753 |

FOREIGN PATENT DOCUMENTS

| | | |
|---|---|---|
| EP | 0 477 424 A1 | 4/1992 |
| EP | 2 015 351 A1 | 1/2009 |
| JP | 2005-537680 A | 12/2005 |
| JP | 2010-093194 A | 4/2010 |
| KR | 10-1997-0052617 A | 7/1997 |
| KR | 10-2008-0104030 A | 11/2008 |
| KR | 10-2009-0030225 A | 3/2009 |
| KR | 10-2009-0102508 A | 9/2009 |
| WO | 2007/129555 A1 | 11/2007 |
| WO | WO 2009/072438 A1 | 6/2009 |
| WO | WO2009072438 * | 6/2009 ............ H01L 21/308 |
| WO | WO 2009/119995 A2 | 10/2009 |

OTHER PUBLICATIONS

WPI/Thomson Database Document "XP-002714820," WPI Week 200931, Thomson Scientific, London, GB (corresponding to CN 101392376 A published Mar. 25, 2009).

A. Ruderisch et al., "Synthesis and characterization of a novel resorcinarene-based stationary phase bearing polar headgroups for use in reversed-phase high-performance liquid chromatography," Journal of Chromatography A, vol. 1095, No. 1-2, pp. 40-49 (Nov. 18, 2005).

Google Scholar Search on "Bayowet FT surfactant," printed on Oct. 29, 2014.

H.F. Schroder, Journal of Chromatography A, vol. 1020, year 2003, pp. 131-151.

Taiwanese Office Action issued in corresponding application No. 100128913 dated Sep. 2, 2015—9 pages with English translation.

\* cited by examiner

TEXTURE-ETCHANT COMPOSITION FOR CRYSTALLINE SILICON WAFER AND METHOD FOR TEXTURE-ETCHING (1)

CROSS REFERENCE TO RELATED APPLICATION

This application claims the benefit of Korean Patent Application No. KR 10-2010-0077621, filed Aug. 12, 2010, which is hereby incorporated by reference in its entirety into this application.

BACKGROUND OF THE INVENTION

1. Technical Field

The present invention relates to an etching composition for texturing a crystalline silicon wafer and a method of etching a crystalline silicon wafer using the etching composition. More particularly, the present invention relates to an etching composition for texturing a crystalline silicon wafer, which can uniformly texture the surface of a crystalline silicon wafer in a fine pyramid shape to obtain high absorbance, and to a method of etching a crystalline silicon wafer using the etching composition.

2. Description of the Related Art

Worldwide, novel renewable energy sources, which are new power sources, have been actively introduced because of fossil energy depletion, rises in the price of oil, climate change, environmental problems and the like. Currently, examples of novel renewable energy sources, which are used as alternatives to source of fossil fuel energy, include solar light, solar heat, wind force, biomass, fuel cells, water power, and the like. Among them, solar energy generation using a solar cell is spreading with the most activity.

A solar cell is a photoelectric cell that converts solar energy into electric energy. Examples of photoelectric cells include a selenium photoelectric cell using the contact between a metal and a semiconductor, a copper sulfite photoelectric cell, a crystalline silicon photoelectric cell using the principle of a P-N junction semiconductor, and the like. Crystalline silicon photoelectric cells are made into a P-N junction semiconductor substrate fabricated by diffusing phosphorus into the surface of a P-type silicon semiconductor, in which boron is added to silicon, to attach an N-type silicon semiconductor to the P-type silicon semiconductor. When an electric field is formed by the P-N junction in such a P-N junction semiconductor substrate and the substrate is irradiated with light such as solar light, electrons (−) and holes (+) are excited, and thus move freely. In this case, when electrons (−) and holes (+) come into the electric field formed by the P-N junction, electrons (−) reach an N-type semiconductor, and holes (+) reach a P-type semiconductor. Here, when electrodes are formed on the surface of the P-type semiconductor and the surface of the N-type semiconductor and electrons flow to an external circuit, electric current is generated. Owing to this principle, solar energy is converted into electric energy. Therefore, in order to maximize the electrical power of a silicon photoelectric cell per unit area, it is required to decrease the reflectance of the silicon photoelectric cell and to maximize its absorbance. For this purpose, the surface of a silicon wafer for a solar cell is textured in a fine pyramid shape and is treated with an antireflective film. The silicon surface textured in the fine pyramid shape decreases the reflectance of incident light across a wide band of wavelengths to increase the intensity of previously-absorbed light, thereby increasing the performance, that is, the efficiency of a solar cell. To date, various methods for texturing the surface of a silicon wafer in a fine pyramid shape have been researched and developed. Specific examples thereof are as follows.

U.S. Pat. No. 4,137,123 discloses a silicon texturing etchant in which 0.5 to 10 wt % of silicon is dissolved in an anisotropic etchant including 0 to 75 wt % of ethylene glycol, 0.05 to 50 wt % of potassium hydroxide and residual deionized water. However, when this silicon texturing etchant is used, there is a problem in that the formation of pyramids on a silicon surface is poor, so that reflectance increases, thereby decreasing the efficiency of a solar cell.

European Patent Publication No. 0477424A1 discloses a texture etching method accompanying an aerating process wherein oxygen is supplied to a texture etching solution in which silicon is dissolved in a solution including ethylene glycol, potassium hydroxide and residual deionized water. However, when this texture etching method is used, there are problems of pyramids being poorly formed on the silicon surface, so that reflectance increases, thereby decreasing the efficiency of the solar cell, and in that an aerator must be additionally provided.

Korean Patent Publication No. 1997-0052617 discloses a texture etching solution including 0.5 to 5 vol % of a potassium hydroxide solution, 3.0 to 20 vol % of isopropyl alcohol and 75 to 96.5 vol % of deionized water. Further, U.S. Pat. No. 6,451,218 discloses a texture etching solution including an alkaline compound, isopropanol, water-soluble alkaline ethylene glycol and residual deionized water. However, these texture etching solutions are problematic in that, since isopropyl alcohol has a low boiling point, isopropyl alcohol must be additionally supplied during a texturing process, so that a large amount of isopropyl alcohol is used, with the result that they are disadvantageous in terms of productivity and economic efficiency, and in that the temperature gradient of the chemical occurs because isopropyl alcohol is supplied during the texturing process, thus deteriorating the texture uniformity of the surface of a silicon wafer.

As described above, the conventional texturing process of a silicon wafer was problematic in that, when only potassium hydroxide is used, a silicon wafer is anisotropically etched, thus increasing the reflectance of the silicon wafer. In order to solve this problem, potassium hydroxide was used in combination with isopropyl alcohol. However, even in this case, there was a problem in that, since the texturing process is conducted at 75 to 80° C., isopropyl alcohol having a boiling point of 80° C. is volatilized, so that isopropyl alcohol must be additionally supplied during the texturing process, with the result that there is a temperature gradient in the chemical, thereby deteriorating the texture uniformity of the surface of the silicon wafer.

SUMMARY OF THE INVENTION

Accordingly, the present invention has been devised to solve the above-mentioned problems, and an object of the present invention is to provide an etching composition for texturing a crystalline silicon wafer, which can form a uniform texture on the surface of a crystalline silicon wafer in a fine pyramid shape to easily absorb light, which can remarkably reduce the usage of the etching composition compared to that of a conventional etching composition using a cyclic compound having a high boiling point so that a larger number of crystalline silicon wafers can be treated, which does not require additional silicon particles for forming fine pyramids, and does not require to introduce chemical during an aerating process (oxygen supply process) or a texturing process, and to a method of etching a crystalline silicon wafer using the etching composition.

In order to accomplish the above object, an aspect of the present invention provides an etching composition for texturing a crystalline silicon wafer, comprising, based on a total amount of the composition: 0.1 to 20 wt % of an alkaline compound; 0.1 to 50 wt % of a cyclic compound having a boiling point of 100° C. or more; 0.00001 to 10 wt % of a silica-containing compound; and residual water.

Another aspect of the present invention provides a method of etching a crystalline silicon wafer using the etching composition.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
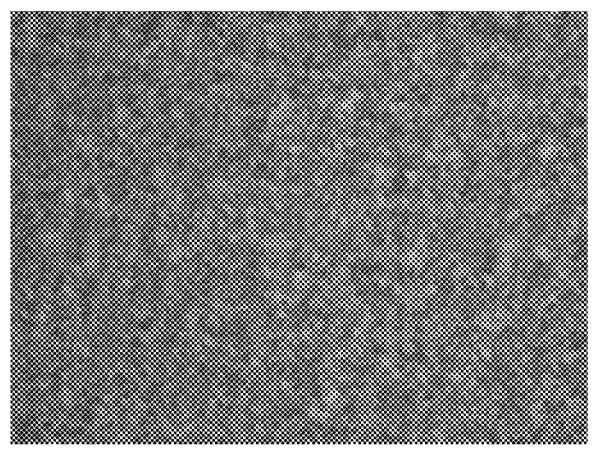
FIG. 1 is an optical micrograph showing a texture of a crystalline silicon wafer treated with an etching composition of Example 6.

Hereinafter, preferred embodiments of the present invention will be described in detail with reference to the attached drawings.

The present invention provides an etching composition for texturing a crystalline silicon wafer and a method of etching a crystalline silicon wafer using the etching composition. More particularly, the present invention provides an etching composition for texturing a crystalline silicon wafer, which can uniformly texture the surface of a crystalline silicon wafer in a fine pyramid shape to obtain high absorbance, and to a method of etching a crystalline silicon wafer using the etching composition.

The etching composition for texturing a crystalline silicon wafer according to the present invention includes (A) an alkaline compound; (B) a cyclic compound having a boiling point of 100° C. or more; (C) a silica-containing compound; and (D) water.

The alkaline compound (A) included in the etching composition of the present invention may be included in an amount of 0.1 to 20 wt %, preferably 1 to 5 wt %, based on the total amount of the composition. When the amount of the alkaline compound is present within the above range, the surface of a crystalline silicon wafer is etched.

The alkaline compound may be any one selected from the group consisting of potassium hydroxide, sodium hydroxide, ammonium hydroxide, tetrahydroxymethyl ammonium, tetrahydroxyethyl ammonium, and mixtures thereof. More preferably, the alkaline may be potassium hydroxide and/or sodium hydroxide.

The cyclic compound (B) having a boiling point of 100° C. or more, preferably 150° C. to 400° C., included in the etching composition of the present invention may be included in an amount of 0.1 to 50 wt %, preferably 2 to 10 wt %, based on the total amount of the composition. When the amount of the cyclic compound is present within the above range, the cyclic compound improves the wettability of the surface of a crystalline silicon wafer, and thus prevents the surface thereof from being overetched by the alkaline compound, thereby forming uniform fine pyramids on the surface thereof. Further, the cyclic compound serves to prevent the occurrence of a bubble stick phenomenon by rapidly reducing the etched and dissolved hydrogen bubbles.

Here, the cyclic compound is a cyclic compound of $C_4$ to $C_{10}$ or a heterocyclic compound of $C_4$ to $C_{10}$ including one or more heterogeneous elements selected from among N, O and S.

The cyclic compound having a boiling point of 100° C. or more may be one or more selected from the group consisting of piperazines, morpholines, pyridines, piperidines, piperidones, pyrrolidines, pyrrolidones, imidazolidinones, furans, anilines, toluidines, and lactones. Specific examples of the cyclic compound having a boiling point of 100° C. or more may include piperazine, N-methylpiperazine, N-ethylpiperazine, hydroxyethylpiperazine, N-(2-aminoethyl)piperazine, N,N'-dimethylpiperazine, morpholine, N-methylmorpholine, N-ethylmorpholine, N-phenylmorpholine, N-cocomorpholine, N-(2-aminoethyl)morpholine, N-(2-cyanoethyl)morpholine, N-(2-hydroxyethyl)morpholine, N-(2-hydroxypropyl)morpholine, N-acetylmorpholine, N-formylmorpholine, N-methymorpholine-N-oxide, picoline, N-methylpiperidine, 3,5-dimethylpiperidine, N-ethylpiperidine, N-(2-hydroxyethyl)piperidine, N-methyl-4-piperidone, N-vinyl-2-piperidone, N-methylpyrrolidine, N-methylpyrrolidone, N-ethyl-2-pyrrolidone, N-isopropyl-2-pyrrolidone, N-butyl-2-pyrrolidone, N-tert-butyl-2-pyrrolidone, N-hexyl-2-pyrrolidone, N-octyl-2-pyrrolidone, N-benzyl-2-pyrrolidone, N-cyclohexyl-2-pyrrolidone, N-vinly-2-pyrrolidone, N-(2-hydroxyethyl)-2-pyrrolidone, N-(2-methoxyethyl)-2-pyrrolidone, N-(2-methoxypropyl)-2-pyrrolidone, N-(2-ethoxyethyl)-2-pyrrolidone, N-methylimidazolidinone, dimethylimidazolidinone, N-(2-hydroxyethyl)-ethyleneurea, tetrahydrofuran, tetrahydrofurfurylalcohol, N-methylaniline, N-ethylaniline, N,N-dimethylaniline, N-(2-hydroxyethyl)aniline, N,N-bis-(2-hydroxyethyl)aniline, N-ethyl-N-(2-hydroxyethyl)aniline, N,N-diethyl-o-toluidine, N-ethyl-N-(2-hydroxyethyl)-m-toluidine, dimethylbenzylamine, γ-butyrolactone, tolyltriazole, 1,2,3-benzotriazole, 1,2,3-triazole, 1,2,4-triazole, 3-amino-1,2,4-triazole, 4-amino-4H-1,2,4-triazole, 1-hydroxybenzotriazole, 1-methylbenzotriazole, 2-methylbenzotriazole, 5-methylbenzotriazole, benzotriazole-5-carbonate, nitrobenzotriazole, and 2-(2H-benzotriazol-2-yl)-4, 6-di-tert-butylphenol.

The silica-containing compound (C) included in the etching composition of the present invention may be included in an amount of 0.00001 to 10 wt %, preferably 0.0001 to 1 wt %, based on the total amount of the composition. When the amount of the silica-containing compound is present within the above range, the silica-containing compound is physically adsorbed on the surface of a crystalline silicon wafer, and thus serves as a mask, thereby forming pyramids on the surface thereof.

The silica-containing compound may be one or more selected from the group consisting of powdered silica, silica-containing colloidal solutions, and liquid metal silicates. Specific examples of the silica-containing compound my include powdered silica; a colloidal silica solution stabilized with $Na_2O$; a colloidal silica solution stabilized with $K_2O$; a colloidal silica solution stabilized with acidic liquid; a colloidal silica solution stabilized with $NH_3$; a colloidal silica solution stabilized with an organic solvent such as ethyl alcohol, propyl alcohol, ethylene glycol, methyl ethyl ketone (MEK) or methyl isobutyl ketone (MIBK); liquid sodium silicate; liquid potassium silicate; and liquid lithium silicate.

The water (D) included in the etching composition of the present invention is included as a remainder such that the total amount of the composition is 100 wt %. The water may be deionized distilled water, and the deionized distilled water is used for a semiconductor process and has a specific resistance of 18 MΩ/cm or more.

The etching composition of the present invention may further include: (E) a fluorine-based surfactant. The fluorine-based surfactant may be included in an amount of 0.000001 to 10 wt %, preferably 0.0001 to 1 wt %, based on the total amount of the composition. When the amount of the fluorine-based surfactant is present within the above range, the fluorine-based surfactant decreases the surface tension of the etching composition together with the cyclic compound having a boiling point of 100° C. or more to improve the wettability of the surface of a crystalline silicon wafer, thereby preventing the surface thereof from being overetched by the alkaline compound.

The fluorine-based surfactant may be one or more selected from the group consisting of anionic fluorine-based surfactants, cationic fluorine-based surfactants, amphoteric ionic fluorine-based surfactants, and nonionic fluorine-based surfactants. Specific examples of the fluorine-based surfactant may include anionic fluorine-based surfactants including perfluoroalkyl carboxylates, perfluoroalkyl sulfonates, perfluoroalkyl sulfates, and perfluoroalkyl phosphates; cationic fluorine-based surfactants including perfluoroalkyl amines and perfluoroalkyl quaternary ammoniums; amphoteric ionic fluorine-based surfactants including perfluoroalkyl carboxybetaine and perfluoralkyl sulfobetaine; and nonionic fluorine-based surfactants including fluoroalkyl polyoxyethylene and perfluoroalkyl polyoxyethylene.

The etching composition of the present invention may be applied to any of dipping-type, spraying-type and single sheet-type etching processes.

Further, the present invention provides a method of etching a crystalline silicon wafer by either or both dipping and/or spraying at 50~100° C. for 30 seconds~60 minutes using the above etching composition including (A) 0.1 to 20 wt % of an alkaline compound, (B) 0.1 to 50 wt % of a cyclic compound having a boiling point of 100° C. or more, (C) 0.00001 to 10 wt % of a silica-containing compound, and (D) water, if necessary, further including 0.000001 to 10 wt % of a fluorine-based surfactant.

Hereinafter, the present invention will be described in more detail with reference to the following Examples. However, these Examples are set forth to illustrate the present invention, and the scope of the present invention is not limited to these Examples. The following Examples may be modified and changed by those skilled in the art within the scope of the present invention.

Examples 1 to 14 and Comparative Examples 1 to 4

Preparation of Etching Composition for Texturing Crystalline Silicon Wafer

Etching compositions for texturing a crystalline silicon wafer of Examples 1 to 14 and Comparative Examples 1 to 4 were prepared according to the components and composition ratios given in Table 1 below.

TABLE 1

| | Alkaline compound | | Cyclic compound | | Silica-containing compound | | Fluorine-based surfactant | | Deionized distilled water |
|---|---|---|---|---|---|---|---|---|---|
| | kind | content (wt %) | kind | content (wt %) | kind | content (wt %) | kind | content (wt %) | |
| Ex. 1 | KOH | 2 | NMP | 5 | SSS | 0.5 | — | — | remainder |
| Ex. 2 | KOH | 2 | NMM | 5 | SSS | 0.5 | — | — | remainder |
| Ex. 3 | KOH | 2 | NMP | 5 | CS | 0.5 | — | — | remainder |
| Ex. 4 | KOH | 2 | NMM | 5 | CS | 0.5 | — | — | remainder |
| Ex. 5 | KOH | 2 | NMP AEP | 6.5 0.5 | SSS | 0.5 | — | — | remainder |
| Ex. 6 | KOH | 2 | NMP GBL | 4.9 0.1 | SSS | 0.5 | — | — | remainder |
| Ex. 7 | KOH | 2 | NMM AEP | 6.5 0.5 | SSS | 0.5 | — | — | remainder |
| Ex. 8 | KOH | 2 | NMM GBL | 4.9 0.1 | SSS | 0.5 | — | — | remainder |
| Ex. 9 | KOH | 2 | NMP AEP | 6.5 0.5 | CS | 0.5 | — | — | remainder |
| Ex. 10 | KOH | 3 | NMP AEP | 6.5 0.5 | CS | 0.5 | — | — | remainder |
| Ex. 11 | KOH | 4 | NMP AEP | 6.5 0.5 | CS | 0.5 | — | — | remainder |
| Ex. 12 | NaOH | 2 | NMP AEP | 6.5 0.5 | SSS | 0.5 | — | — | remainder |
| Ex. 13 | KOH | 2 | NMP AEP | 6.5 0.5 | SSS | 0.5 | PFAS | 0.001 | remainder |
| Ex. 14 | KOH | 2 | NMP AEP | 6.5 0.5 | CS | 0.5 | PFAP | 0.001 | remainder |
| Comp. Ex. 1 | KOH | 1.5 | IPA | 5 | — | — | — | — | remainder |
| Comp. Ex. 2 | KOH | 1.5 | EG | 5 | — | — | — | — | remainder |

TABLE 1-continued

| | Alkaline compound | | Cyclic compound | | Silica-containing compound | | Fluorine-based surfactant | | Deionized distilled water |
|---|---|---|---|---|---|---|---|---|---|
| | kind | content (wt %) | kind | content (wt %) | kind | content (wt %) | kind | content (wt %) | |
| Comp. Ex. 3 | KOH | 1.5 | MDG | 5 | — | — | — | — | remainder |
| Comp. Ex. 4 | KOH | 1.5 | MEA | 5 | — | — | — | — | remainder | note)
KOH: potassium hydroxide
NaOH: sodium hydroxide
NMP: N-methylpyrrolidone
NMM: N-methylmorpholine
AEP: aminoethylpiperazine
GBL: γ-butyrolactone
IPA: isopropyl alcohol
EG: ethylene glycol
MDG: methyldiglycol
MEA: monoethylamine
PFAS: perfluoroalkyl sulfate
PFAP: perfluoroalkyl phosphate
SSS: liquid soldium silicate
CS: colloidal silica (stabilized with $Na_2O$)

Test Example

Evaluation of Properties of Etching Composition for Texturing Crystalline Silicon Wafer A single-crystal silicon wafer was immersed in each of the etching compositions for texturing a crystalline silicon wafer of Examples 1 to 14 and Comparative Examples 1 to 4. In this case, texturing was performed under conditions of 80° C. and 30 minutes. The texture uniformity of each etching composition was evaluated with the naked eye (digital camera), optical microscope, scanning electron microscope (SEM) or the like, and the size of pyramids was measured using SEM. The average reflectance of each etching composition was measured when UV light having a wavelength range of 400~800 nm was radiated. The results thereof are shown in Table 2 below and FIGS. 1 to 3.

TABLE 2

| Class. | Texture uniformity | Average size of pyramids (μm) | Average reflectance (%) |
|---|---|---|---|
| Ex. 1 | ◎ | 5 | 12.53 |
| Ex. 2 | ◎ | 6 | 12.46 |
| Ex. 3 | ◎ | 5 | 12.28 |
| Ex. 4 | ◎ | 6 | 12.65 |
| Ex. 5 | ◎ | 6 | 12.35 |
| Ex. 6 | ◎ | 6 | 12.24 |
| Ex. 7 | ◎ | 5 | 12.15 |
| Ex. 8 | ◎ | 5 | 12.45 |
| Ex. 9 | ◎ | 5 | 12.49 |
| Ex. 10 | ◎ | 8 | 12.60 |
| Ex. 11 | ◎ | 11 | 12.69 |
| Ex. 12 | ◎ | 7 | 12.21 |
| Ex. 13 | ◎ | 3 | 12.21 |
| Ex. 14 | ◎ | 3 | 12.32 |
| Comp. Ex. 1 | ○ | 5 | 13.22 |
| Comp. Ex. 2 | X | 10 | 21.13 |
| Comp. Ex. 3 | chemical discolored | | |
| Comp. Ex. 4 | chemical discolored | | |

※Texture uniformity
◎: formation of pyramids over the entire surface of wafer
○: formation of pyramids on part of the wafer (the degree to which pyramids were not formed is less than 5%)
X: formation of no pyramids on the wafer (the degree to which pyramids were not formed is more than 90%)
The term "chemical discolored" indicates that there was no need for a texture test due to the spontaneous change with time upon heating to the texturing temperature.

Figure 2:
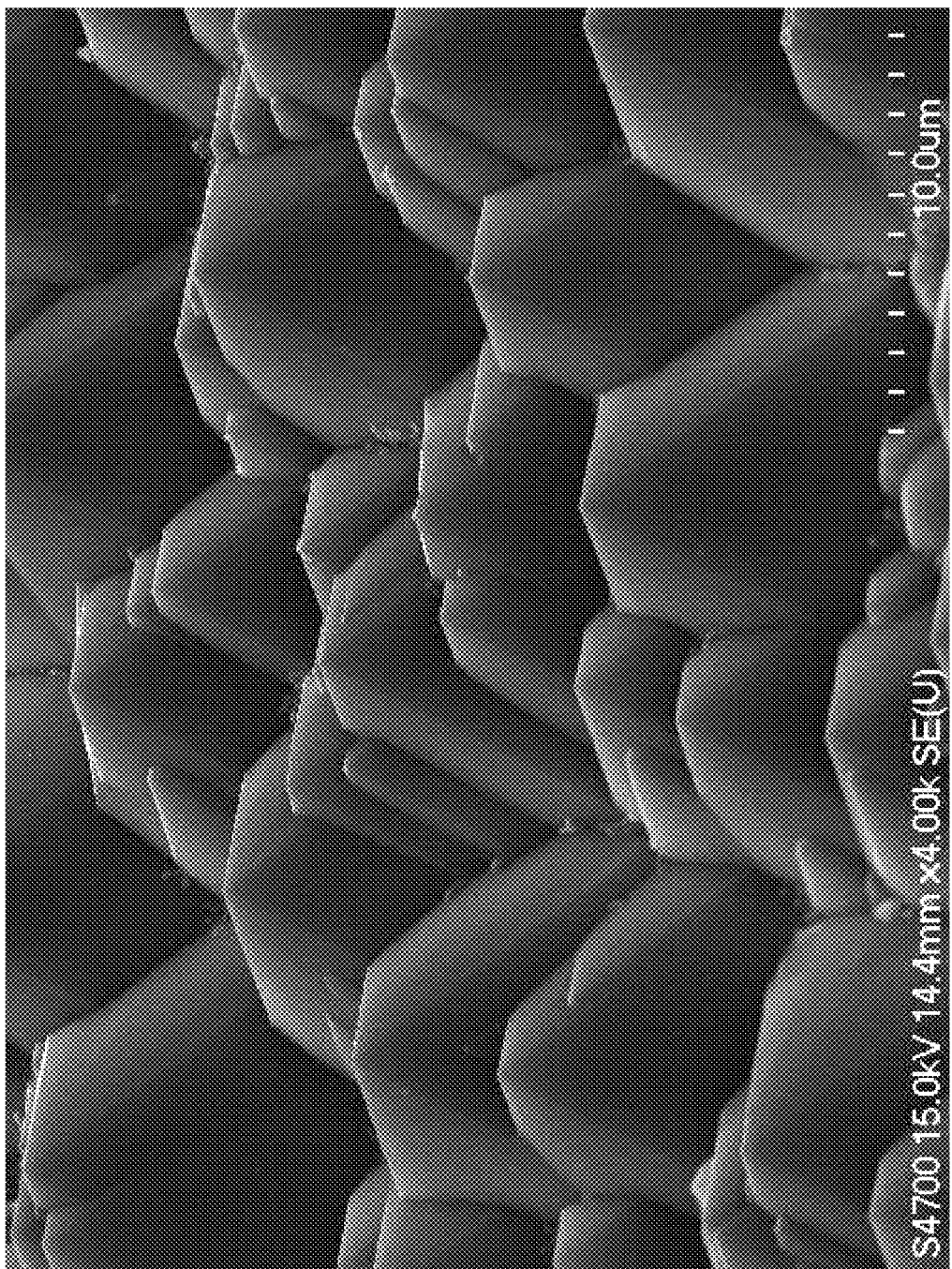
FIG. 2 is an SEM photograph showing a surface of a crystalline silicon wafer textured with the etching composition of Example 6.
Figure 3:
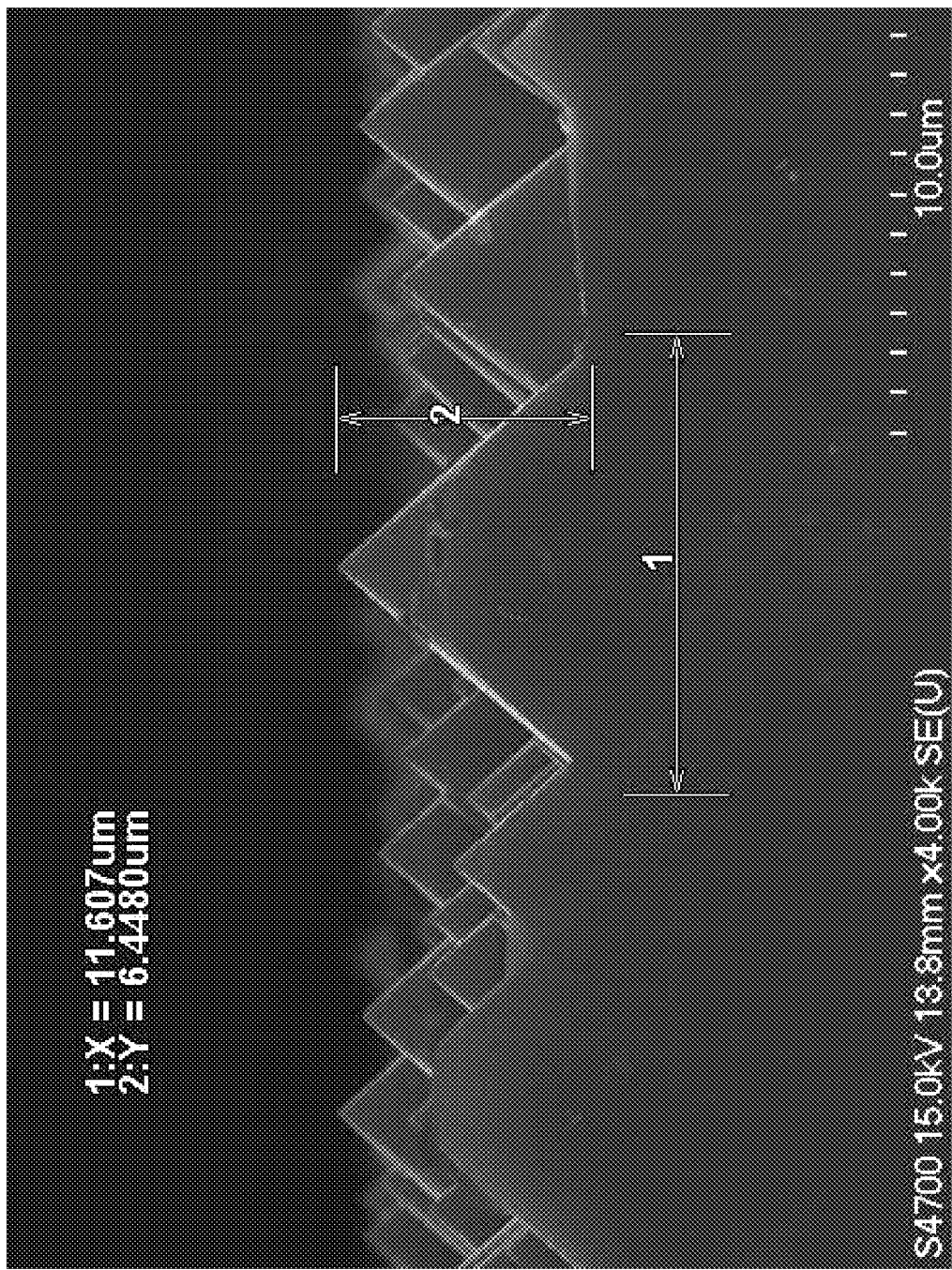
FIG. 3 is an SEM photograph showing a section of a crystalline silicon wafer textured with the etching composition of Example 6.

Referring to Table 2 above and FIGS. 1 to 3, it can be seen that the texture uniformity of the single-crystal silicon wafer using the etching compositions of Examples 1 to 14 is excellent.

However, the etching composition of Comparative Example 1 is problematic because IPA should be continuously added during the texturing process due to its low boiling point, thus deteriorating the texture uniformity (which is caused by the temperature gradient occurring because of the intermittent addition of IPA) and increasing the texturing cost.

Further, the texture uniformity and reflectance of the etching composition of Comparative Example 2 are considerably inferior to those of the etching compositions of Examples 1 to 14. In addition, in the case of the etching compositions of Comparative Examples 3 and 4, there was no need for a texture test due to the spontaneous change with time upon heating to the texturing temperature.

Meanwhile, FIG. 1 is an optical micrograph showing a texture of a crystalline silicon wafer treated with an etching composition of Example 6. FIG. 2 is an SEM photograph showing a surface of a crystalline silicon wafer textured with the etching composition of Example 6. FIG. 3 is an SEM photograph showing a section of a crystalline silicon wafer textured with the etching composition of Example 6. Referring to FIGS. 1 to 3, it can be seen that pyramids were formed over the entire surface of the wafer.

As described above, the etching composition for texturing a crystalline silicon wafer according to the present invention is advantageous in that it can maximize the absorbance of light by forming uniform fine pyramids on a crystalline silicon wafer, in that it can treat a larger number of crystalline silicon wafers compared to a conventional etching composition, thus increasing economic efficiency, and in that it does not need an aerating apparatus and a chemical introducing process, thus reducing the initial production cost and forming uniform and fine pyramids.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An etching composition for texturing a crystalline silicon wafer, comprising, based on a total amount of the composition:

0.1 to 20 wt % of an alkaline compound;
0.1 to 50 wt % of a cyclic compound having a boiling point of 100° C. or more;
0.00001 to 10 wt % of a silica-containing compound; and residual water,
wherein the cyclic compound having a boiling point of 100° C. or more is one or more selected from the group consisting of piperazine, N-methylpiperazine, N-ethylpiperazine, hydroxyethylpiperazine, N-(2-aminoethyl)piperazine, N,N'-dimethylpiperazine, morpholine, N-methylmorpholine, N-ethylmorpholine, N-phenylmorpholine, N-cocomorpholine, N-(2-aminoethyl)morpholine, N-(2-cyanoethyl)morpholine, N-(2-hydroxyethyl)morpholine, N-(2-hydroxypropyl)morpholine, N-acetylmorpholine, N-formylmorpholine, N-methymorpholine-N-oxide, picoline, N-methylpiperidine, 3,5-dimethylpiperidine, N-ethylpiperidine, N-(2-hydroxyethyl)piperidine, N-methyl-4-piperidone, N-vinyl-2-piperidone, N-methylpyrrolidine, N-methylpyrrolidone, N-ethyl-2-pyrrolidone, N-isopropyl-2-pyrrolidone, N-butyl-2-pyrrolidone, N-tert-butyl-2-pyrrolidone, N-hexyl-2-pyrrolidone, N-octyl-2-pyrrolidone, N-benzyl-2-pyrrolidone, N-cyclohexyl-2-pyrrolidone, N-vinly-2-pyrrolidone, N-(2-hydroxyethyl)-2-pyrrolidone, N-(2-methoxyethyl)-2-pyrrolidone, N-(2-methoxypropyl)-2-pyrrolidone, N-(2-ethoxyethyl)-2-pyrrolidone, N-methylimidazolidinone, dimethylimidazolidinone, N-(2-hydroxyethyl)-ethyleneurea, tetrahydrofuran, tetrahydrofurfurylalcohol, N-methylaniline, N-ethylaniline, N,N-dimethylaniline, N-(2-hydroxyethyl)aniline, N,N-bis-(2-hydroxyethyl)aniline, N-ethyl-N-(2-hydroxyethyl) aniline, N,N-diethyl-o-toluidine, N-ethyl-N-(2-hydroxyethyl)-m-toluidine, dimethylbenzylamine, γ-butyrolactone, tolyltriazole, 1,2,3-benzotriazole, 1,2,3-triazole, 1,2,4-triazole, 3-amino-1,2,4-triazole, 4-amino-4H-1,2,4-triazole, 1-hydroxybenzotriazole, 1-methylbenzotriazole, 2-methylbenzotriazole, 5-methylbenzotriazole, benzotriazole-5-carbonate, nitrobenzotriazole, and 2-(2H-benzotriazol-2-yl)-4,6-di-tert-butylphenol, and wherein the silica-containing compound is one or more selected from the group consisting of liquid sodium silicate; liquid potassium silicate; and liquid lithium silicate.

2. The etching composition according to claim 1, wherein the alkaline compound is one or more selected from the group consisting of potassium hydroxide, sodium hydroxide, ammonium hydroxide, tetrahydroxymethyl ammonium, and tetrahydroxyethyl ammonium.

3. The etching composition according to claim 1, further comprising: 0.000001 to 10 wt % of a fluorine-based surfactant.

4. The etching composition according to claim 3, wherein the fluorine-based surfactant is one or more selected from the group consisting of anionic fluorine-based surfactants including perfluoroalkyl carboxylates, perfluoroalkyl sulfonates, perfluoroalkyl sulfates, and perfluoroalkyl phosphates; cationic fluorine-based surfactants including perfluoroalkyl amines and perfluoroalkyl quaternary ammoniums; amphoteric ionic fluorine-based surfactants including perfluoroalkyl carboxybetaine and perfluoroalkyl sulfobetaine; and nonionic fluorine-based surfactants including fluoroalkyl polyoxyethylene and perfluoroalkyl polyoxyethylene.

5. The etching composition according to claim 1, wherein the cyclic compound has a boiling point of 150° C. to 400° C.

6. A method of etching a crystalline silicon wafer by dipping and/or spraying the crystalline silicon wafer at 50~100° C. for 30 seconds~60 minutes using the etching composition of any one of claims 1, 2, 3, 4 and 5.

* * * * *